US012748511B2

(12) United States Patent
Wang et al.

(10) Patent No.: US 12,748,511 B2
(45) Date of Patent: Sep. 29, 2026

(54) DISPLAY PANELS AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Zhiqiang Wang, Beijing (CN); Jaeseung Kim, Beijing (CN); Shuai Liu, Beijing (CN); Ping Luo, Beijing (CN); Guiyu Zhang, Beijing (CN); Qiang Wang, Beijing (CN); Shukui Yang, Beijing (CN); Liqing Jiang, Beijing (CN)

(73) Assignees: Chengdu BOE Optoelectroncis Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 19/258,906

(22) Filed: Jul. 3, 2025

(65) Prior Publication Data

US 2025/0328207 A1 Oct. 23, 2025

Related U.S. Application Data

(63) Continuation of application No. 18/276,637, filed as application No. PCT/CN2022/120676 on Sep. 22, 2022, now Pat. No. 12,393,303.

(51) Int. Cl.

| | |
|---|---|
| ***G06F 3/041*** | (2006.01) |
| ***G06F 3/044*** | (2006.01) |
| ***H10K 59/40*** | (2023.01) |

(52) U.S. Cl.
CPC .......... *G06F 3/0418* (2013.01); *G06F 3/0412* (2013.01); *G06F 3/04164* (2019.05);
(Continued)

(58) Field of Classification Search
CPC ........... G06F 2203/04107; G06F 3/041; G06F 3/0412; G06F 3/04164; G06F 3/04166; G06F 3/0418; G06F 3/0443; G06F 3/0446
See application file for complete search history.

(56) References Cited

U.S. PATENT DOCUMENTS

2023/0205357 A1* 6/2023 Yoo ........................ G06F 3/0446 345/173
2023/0217778 A1* 7/2023 Han ...................... G06F 3/0443 345/173

(Continued)

*Primary Examiner* — Robin J Mishler
(74) *Attorney, Agent, or Firm* — IPro, PLLC

(57) ABSTRACT

The disclosure relates to a display panel having a display region and a bezel region. The display panel includes a base, drive arrays, cathodes, a shielding layer, transfer traces, touch portions and touch lines. The drive arrays are on the base, and configured to drive the display panel to emit light. Cathodes are on a side of the drive arrays away from the base. The transfer traces is on a side of the cathodes away from the base, and in the bezel region. The touch lines are used to send touch signals and respectively electrically connected with the transfer traces. The shielding layer is between the cathodes and the transfer traces and is in the bezel region. A projection of the drive arrays in the bezel region onto the base is in a projection of the shielding layer onto the base. The shielding layer is configured to shield noise signals.

20 Claims, 8 Drawing Sheets

(52) U.S. Cl.
CPC ........ *G06F 3/04166* (2019.05); *G06F 3/0446* (2019.05); *H10K 59/40* (2023.02); *G06F 2203/04107* (2013.01)

(56) References Cited

U.S. PATENT DOCUMENTS

2023/0217779 A1 * 7/2023 Kim ...................... G06F 3/0443
257/72
2024/0004488 A1 * 1/2024 Jung ..................... G06F 3/0446

* cited by examiner

DISPLAY PANELS AND DISPLAY APPARATUS

CROSS-REFERENCE TO RELATED APPLICATIONS

This application is a continuation application of application Ser. No. 18/276,637, which is a national stage of international PCT Application No. PCT/CN2022/120676, filed on Sep. 22, 2022, the entire contents of which are incorporated herein by reference.

TECHNICAL FIELD

The present disclosure relates to the field of display technologies, and particularly to a display panel and display apparatus.

BACKGROUND

In the related arts, organic light emitting diodes (OLEDs) have many advantages such as lightness, fast response, wide color gamut, wide viewing angle, low power consumption and curlability.

In recent years, operations of active capacitive styluses are also increasingly becoming routine applications, in applications of the mid-to-high-end tablets and notebooks. However, there are problems with poor touch performance in OLED touch integrated panels, particularly with styluses.

SUMMARY

A display panel and a display apparatus are provided in the present disclosure to address all or part of deficiencies in the related arts.

According to a first aspect of embodiments of the present disclosure, a display panel is provided, where the display panel has a display region and a bezel region, and the display region is adjacent to the bezel region; the display panel includes a base; drive arrays on the base, configured to drive the display panel to emit light; cathodes on a side of the drive arrays away from the base; transfer traces on a side of the cathodes away from the base, in the bezel region; touch lines respectively electrically connected with the transfer traces; and a shielding layer between the cathodes and the transfer traces and in the bezel region; an orthographic projection of the drive arrays in the bezel region onto the base, being in an orthographic projection of the shielding layer onto the base; the shielding layer being configured to shield noise signals; wherein the shielding layer comprises at least one metal layer and at least one dielectric layer that are stacked, the at least one metal layer being connected with the drive arrays.

In some embodiments, the display panel further includes one or more control units, the one or more control units including ground pins, the ground pins being configured to be grounded; the shielding layer is connected with the drive arrays and connected with the ground pins through the one or more drive arrays.

In some embodiments, the display panel further includes an encapsulation layer on a side of the cathode away from the base; where the shielding layer is between the cathodes and the encapsulation layer, and the encapsulation layer covers the shielding layer.

In some embodiments, the display panel further includes anodes and a planarization layer; where the anodes are on a side of the cathodes facing the base and the planarization layer is between the anodes and the base; the shielding layer covers edges of the cathodes; an orthographic projection of a portion of the shielding layer onto the base is outside orthographic projections of the cathodes onto the base, the portion of the shielding layer is electrically connected with the drive arrays through vias of the anodes and the planarization layer.

In some embodiments, the shielding layer includes at least one layer having a metal layer and a dielectric layer that are stacked, the metal layer being connected with the drive arrays.

In some embodiments, the dielectric layer includes silicon nitride or silicon oxide, and the metal layer includes at least one of gold, silver, copper, titanium, molybdenum, aluminium, or tungsten.

In some embodiments, the display panel further includes at least two touch portions, the touch portions each including a plurality of first touch lines and a plurality of second touch lines; where the plurality of the first touch lines extend in a first direction and the plurality of the second touch lines extend in a second direction, and the first direction intersects the second direction; the touch portions are independent of each other.

In some embodiments, borders of two adjacent touch portions are interdigitated.

In some embodiments, a gap is provided between the two adjacent touch portions, and the gap is the borders of the two adjacent touch portions; portions of the first touch lines or portions of the second touch lines on two sides of the gap extend in a direction facing the gap and each form at least one protruding portion, and the protruding portion extends into a depression in a corresponding first touch line or a corresponding second touch line on other side of the gap.

In some embodiments, a shape of the protruding portion is a triangle, a rectangle or a star, and sizes of protruding portions are same or different.

In some embodiments, the first touch lines include first touch electrodes and first connectors that both are arranged alternately in the first direction, and the second touch lines include second touch electrodes and second connectors that both are arranged alternately in the second direction; the gap respectively divides the first touch electrodes or the second touch electrodes through which the gap extends into two parts; the first touch electrodes or portions of the second touch electrodes on two sides of the gap extend in a direction facing the gap and each form at least one protruding portion, and the protruding portion extends into a depression in a corresponding first touch electrode or a corresponding second touch electrode on other side of the gap; geometric centers of the first touch electrodes or the second touch electrodes are center points; in directions away from the central points, extending sizes of protruding portions gradually decrease.

In some embodiments, the display panel includes at least two control units; the transfer traces are on a circumference of the touch portions and the control units are electrically connected with at least one of the touch portions through the transfer traces, and a control unit is electrically connected with a portion of the touch portions; the control units are configured to turn the plurality of the first touch lines and the plurality of the second touch lines on or off in the touch portions.

In some embodiments, the display panel further includes four touch portions arranged in an array; where every two of the touch portions are electrically connected with a control unit through the transfer traces; two control units are configured to independently drive two different touch portions.

In some embodiments, the display panel further includes four touch portions arranged in an array, switch units, one or more control units and a level conversion unit; the touch portions each are electrically connected with a corresponding switch unit through transfer traces; all of the switch units are electrically connected with the level conversion unit and the switch units each are electrically connected with the one or more control units through the level conversion unit; every two of the touch portions are in a touch group; the one or more control units are configured to drive the first touch lines and the second touch lines in a touch group at different periods.

In some embodiments, every two of the four touch portions arranged in an array, adjacent to each other in the first direction, are in a touch group; the one or more control units are configured to drive the first touch lines and the second touch lines in a touch group for a first period and drive the first touch lines and the second touch lines in other touch group for a second period.

In some embodiments, every two of the four touch portions arranged in an array, adjacent to each other in the second direction, are in a touch group; the one or more control units are configured to drive the first touch lines and the second touch lines in a touch group for a first period and drive the first touch lines and the second touch lines in other touch group for a second period.

In some embodiments, every two of the four touch portions arranged in an array, at opposite corners of the array, are in a touch group; the one or more control units are configured to drive the first touch lines and the second touch lines in a touch group for a first period and drive the first touch lines and the second touch lines in other touch group for a second period.

In some embodiments, the switch units each include at least two thin film transistors connected in parallel.

According to a second aspect of the embodiments of the present disclosure, provided is a display panel that has a display region and a bezel region, and the display region is adjacent to the bezel region; the display panel includes a base; drive arrays on the base, configured to drive the display panel to emit light; cathodes on a side of the drive arrays away from the base; transfer traces on a side of the cathodes away from the base, in the bezel region; touch lines respectively electrically connected with the transfer traces; and a shielding layer between the cathodes and the transfer traces and in the bezel region; an orthographic projection of the drive arrays in the bezel region onto the base, being in an orthographic projection of the shielding layer onto the base; the shielding layer being configured to shield noise signals; wherein the display panel further includes one or more control units, the one or more control units including shield pins, where the shield pins are configured to transmit shield signals, and the shield signals are in an opposite direction to signals transmitted in the transfer traces; the shielding layer is connected with the drive arrays and connected with the shield pins through the drive arrays.

According to a third aspect of the embodiments of the present disclosure, provided is a display panel has a display region and a bezel region, and the display region is adjacent to the bezel region; the display panel includes a base; drive arrays on the base, configured to drive the display panel to emit light; cathodes on a side of the drive arrays away from the base; transfer traces on a side of the cathodes away from the base, in the bezel region; touch lines respectively electrically connected with the transfer traces; and a shielding layer between the cathodes and the transfer traces and in the bezel region; an orthographic projection of the drive arrays in the bezel region onto the base, being in an orthographic projection of the shielding layer onto the base; the shielding layer being configured to shield noise signals; wherein the display panel further has a bending region adjacent to the bezel region and on a side of the bezel region away from the display region; a portion of the display panel in the bending region is configured to be bent to a side of the base away from the cathode; the display panel further includes a flexible circuit board on a side of the bending region away from the bezel region; the display panel further includes one or more control units including ground pins, and the ground pins are configured to be grounded; the shielding layer is connected with the flexible circuit board through leads in the bending region and connected with the ground pins through the flexible circuit board.

According to a fourth aspect of the embodiments of the present disclosure, a display apparatus including any of the above display panels is provided.

According to the above embodiments, by providing a shielding layer in the bezel region, the shielding layer is on the side of the cathode away from the base, and the orthographic projection of the drive array in the bezel region onto the base is in the orthographic projection of the shielding layer onto the base. The shielding layer may be configured to shield noise signals, may effectively prevent the generation of parasitic capacitance between the transfer traces and the cathodes, and may effectively avoid, the electromagnetic wave signals radiated from the drive arrays, from coupling into the transfer traces through the parasitic capacitance between the transfer traces and the cathodes, thus, may effectively reduce the noise signal strength in the transfer traces and the touch lines, improve the signal-to-noise ratio in the touch lines, and in turn, may improve the touch performance of the display panel, especially may improve the performance of the display panel when the active stylus is used.

It will be understood that the above general descriptions and the following detailed descriptions are merely for exemplary and explanatory purposes, and cannot limit this application.

BRIEF DESCRIPTION OF DRAWINGS

The accompanying drawings, which are incorporated in and constitute a part of the present description, illustrate examples consistent with the present disclosure and serve to explain the principles of the present disclosure together with the description.

DETAILED DESCRIPTION

Examples of embodiments will be described in detail here, examples of which are illustrated in the accompanying drawings. When the following description relates to the accompanying drawings, unless specified otherwise, the same numerals in different drawings represent the same or similar elements. The implementations described in the following example embodiments do not represent all implementations consistent with the present disclosure. On the contrary, they are merely examples of an apparatus and a method consistent with some aspects of the present disclosure described in detail in the appended claims.

Figure 1:
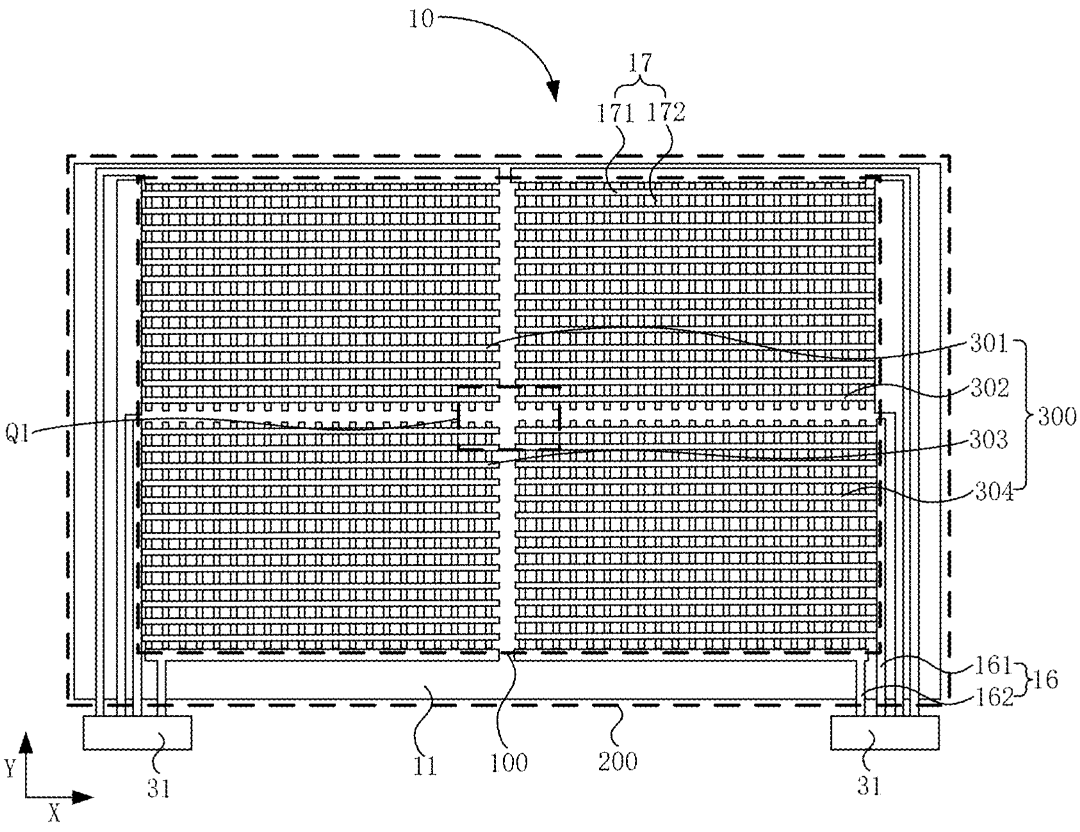
FIG. 1 is a schematic diagram illustrating a display panel in accordance with an embodiment of the present disclosure.

A display panel is provided in embodiments of the present disclosure, FIG. 1 shows a top view of the display panel. As shown in FIG. 1, the display panel 10 has a display region 100 and a bezel region 200. The display region 100 is adjacent to the bezel region 200, and a portion of the display panel 10 in the display region 100 is configured to perform a display function.

Figure 2:
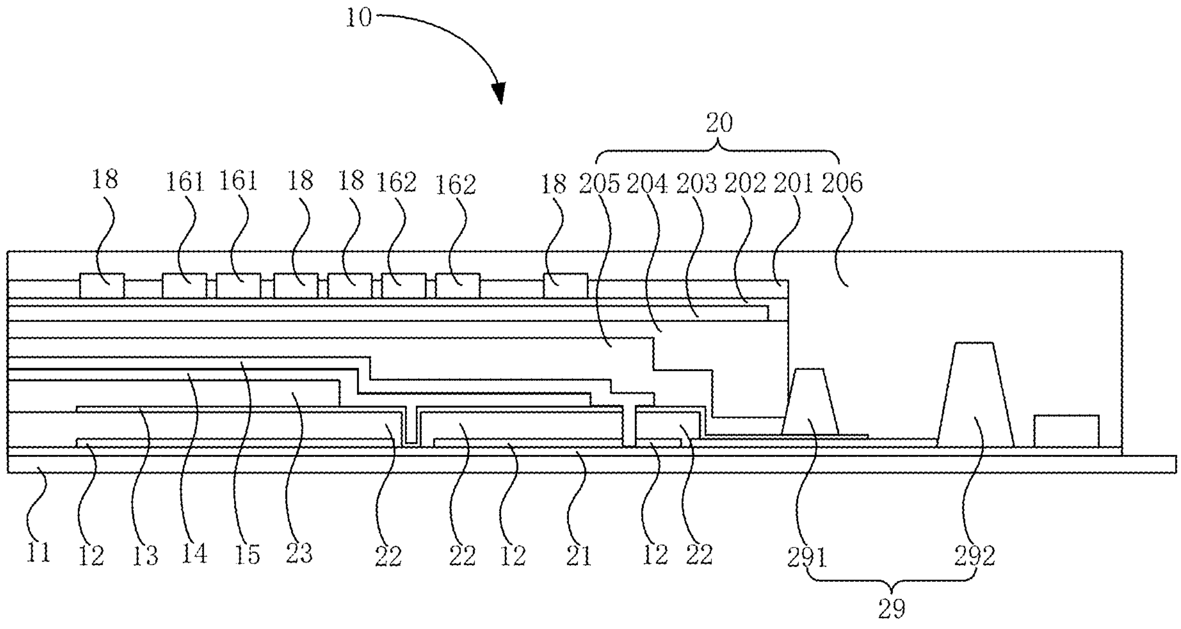
FIG. 2 is a sectional view of a portion of a display panel in a bezel region.

FIG. 2 shows a sectional view of the portion of the display panel in the bezel region. As shown in FIGS. 1 and 2, the display panel includes a base 11, drive arrays 12, anodes 13, cathodes 14, a shielding layer 15, transfer traces 16, touch lines 17, ground traces 18, and control units 31. The drive array 12 is on the base 11 and is configured to drive the display panel 10 to emit light. The cathode 14 is on a side of the drive array 12 away from the base 11 and the shielding layer 15 is on a side of the cathode 14 away from the base 11. The touch line 17 is in the display region 100 and on a side of the shielding layer 15 away from the cathode 14. The transfer trace 16 and the ground trace 18 are in the bezel region 200, and both the transfer trace 16 and the ground trace 18 are on the side of the shielding layer 15 away from the cathode 14. It will be noted that, for the clarity of what is shown in FIG. 1, the ground traces 18 are not shown in FIG. 1, but in specific embodiments, the ground traces 18 may also be in the positions in FIG. 1 corresponding to FIG. 2.

The transfer traces 16 include first transfer traces 161 and second transfer traces 162. Meanwhile, ground traces 18 are between the first transfer traces 161 and the second transfer traces 162, a side of the first transfer traces 161 away from the second transfer traces 162 and a side of the second transfer traces 162 away from the first transfer traces 161 are also provided with ground traces 18. In addition to being grounded by connecting with ground pins of the control unit 31, respective ground traces 18 between the first transfer traces 161 and the second transfer traces 162 are further configured to isolate signals transmitted in the first transfer traces 161 and the second transfer traces 162, and the ground traces 18 on the side of the second transfer traces 162 away from the first transfer traces 161 are further configured to prevent static discharge in the display panel 10. Meanwhile, the ground traces 18 on the side of the first transfer traces 161 away from the second transfer traces 162, may be or be not provided according to actual needs of the embodiments.

The touch lines 17 are respectively electrically connected with the transfer traces 16. The touch lines 17 are configured to generate touch signals.

It will be noted that relative positions of the first transfer traces 161 and the second transfer traces 162 shown in FIG. 2 are only one embodiment, and positions of the first transfer traces 161 and the second transfer traces 162 may also be interchanged. The interchange between the positions of the first transfer traces 161 and the positions of the second transfer traces 162 does not affect the positions of the above ground traces 18 in the entire display panel 10, and numbers of the first transfer traces 161, the second transfer traces 162 and the ground traces 18 are also merely exemplary, and the numbers of the first transfer traces 161, the second transfer traces 162 and the ground traces 18 are not limited herein.

The display panel 10 further includes an encapsulation layer 20, a buffer layer 21, a planarization layer 22, a pixel defining layer 23 and dams 29. The encapsulation layer 20 includes a glass cover 206, an insulating layer 201, an encapsulation buffer layer 202, a first inorganic encapsulation layer 203, an organic encapsulation layer 204 and a second inorganic encapsulation layer 205. The encapsulation layer 20 encapsulates and protects the display panel 10. The first inorganic encapsulation layer 203 and the second inorganic encapsulation layer 205 may be formed by chemical vapour deposition and the organic encapsulation layer 204 may be formed by inkjet printing.

The dams 29 are on the circumference of the first inorganic encapsulation layer 203, the organic encapsulation layer 204 and the second inorganic encapsulation layer 205 and are configured to block the movement of the encapsulation layer 20 relative to the rest of structures of the display panel 10. The dams 29 include first dams 291 and second dams 292. The first dams 291 are on the circumference of and adjacent to the first inorganic encapsulation layer 203, the organic encapsulation layer 204 and the second inorganic encapsulation layer 205, and the first dams 291 are further configured to block the relative movement of the organic encapsulation layer 204.

As the drive arrays 12 in the bezel region 200 at the edge of the display panel 10 are generally configured to transmit high frequency signals, which generate electromagnetic radiation when jumped. And, as parasitic capacitance is generated between the transfer traces 16 and the cathodes 14 and between the touch lines 17 and the cathodes 14, electromagnetic wave signals radiated from the drive arrays 12 are coupled into the transfer traces 16 and the touch lines 17 by parasitic capacitance between the transfer traces 16 and the cathodes 14 and between the touch lines 17 and the cathodes 14, thus, causing these electromagnetic wave signals to couple into the transfer traces 16 and the touch lines 17, creating noise signals. Meanwhile, as the high frequency signals are mainly transmitted by a portion of the drive arrays 12 in the bezel region 200, the noise signals generated by the drive arrays 12 in the bezel region 200 are the strongest and, accordingly, the noise signals in the touch lines 17 are also the strongest.

In addition, when the active stylus is used to operate on the display panel 10, the active stylus needs to couple touch signals operating at a specific frequency into the transfer traces 16 and touch lines 17, to achieve touch control of the display panel 10. As a result, the touch signals of the active stylus tend to interfere significantly with the noise signals in the display panel 10, making the interference of the noise signals to the active stylus more serious.

In view of the above problems, in this embodiment, by providing a shielding layer 15 in the bezel region 200, the shielding layer 15 is on the side of the cathode 14 away from the base 11, and the orthographic projection of the drive arrays 12 in the bezel region 200 onto the base 11 is in the orthographic projection of the shielding layer 15 onto the base 11. The shielding layer 15 may be configured to shield noise signals, may effectively prevent the generation of parasitic capacitance between the transfer traces 16 and the cathodes 14, and may effectively avoid, the electromagnetic wave signals radiated from the drive arrays 12, from coupling into the transfer traces 16 through the parasitic capacitance between the transfer traces 16 and the cathodes 14, thus, may effectively reduce the noise signal strength in the transfer traces 16 and the touch lines 17, improve the signal-to-noise ratio in the touch lines 17, and in turn, may improve the touch performance of the display panel 10, especially the performance of the display panel 10 when the active stylus is used.

In some embodiments, the control unit 31 includes ground pins 311 configured to be grounded, and the shielding layer 15 is connected with the drive arrays 12 and connected with the ground pins 311 through the drive arrays 12. The shielding layer 15 is connected with the ground pins 311 through the drive arrays 12, allowing the shielding layer 15 to be grounded. And as the shielding layer 15 is grounded and the shielding layer 15 is between the transfer traces 16 and the cathodes 14, the generation of parasitic capacitance between the transfer traces 16 and the cathodes 14 may be prevented, and received noise signals may also be eliminated by grounding the shielding layer 15, As a result, the electromagnetic wave signals radiated from the drive arrays 12 may be further effectively avoided from coupling into the transfer traces 16 through the parasitic capacitance between the transfer traces 16 and the cathodes 14, the noise signal strength in the transfer traces 16 and the touch lines 17 may be further effectively reduced, thus further improving the signal-to-noise ratio in the touch lines 17. In turn, the touch performance of the display panel 10 may be further improved, especially the performance of the display panel 10 when the active stylus is used.

In some embodiments, the control unit 31 includes shield pins 312. The shield pins 312 are configured to transmit shield signals, and the shield signals are in an opposite direction to the signals transmitted in the transfer traces 16. The shielding layer 15 is connected with the drive arrays 12 and connected with the shield pins 312 through the drive arrays 12. The shielding layer 15 is connected with the shield pins 312 through the drive arrays 12, allowing the shielding layer 15 to transmit signals in the opposite direction to the signals transmitted in the transfer traces 16. And as the shielding layer 15 may transmit signals in the opposite direction to the signals transmitted in the transfer traces 16 and the shielding layer 15 is between the transfer traces 16 and the cathodes 14, the generation of parasitic capacitance between the transfer traces 16 and the cathodes 14 may be prevented. As a result, the electromagnetic wave signals radiated from the drive arrays 12, may be further effectively avoided from coupling into the transfer traces 16 through the parasitic capacitance between the transfer traces 16 and the cathodes 14, and the noise signal strength in the transfer traces 16 and the touch lines 17 may be further effectively reduced, thus improving the signal-to-noise ratio in the touch lines 17. In turn, the touch performance of the display panel 10 may be further improved, especially the performance of the display panel 10 when the active stylus is used.

Figure 3:
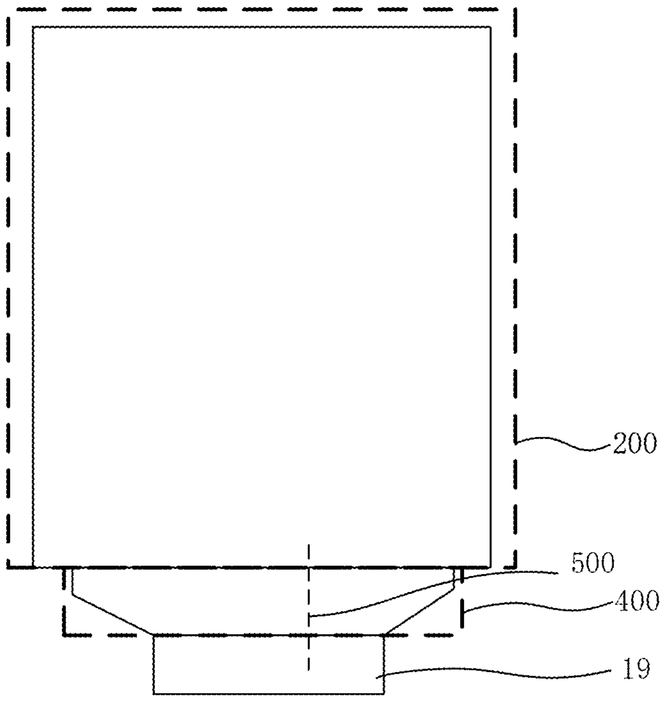
FIG. 3 is a schematic diagram illustrating a display panel in accordance with an embodiment of the present disclosure.

In some embodiments, as shown in FIG. 3, the display panel 10 further includes a bending region 400. The bending region 400 is adjacent to the bezel region 200 and on the side of the bezel region 200 away from the display region 100. The portion of the display panel 10 in the bending region 400 is configured to be bent to the side of the base 11 away from the cathodes 14. The display panel 10 further includes a flexible circuit board 19 on the side of the bending region 400 away from the bezel region 200. The control unit 31 includes ground pins 311, which are configured to be grounded. The shielding layer 15 is connected with the flexible circuit board 19 through leads 500 in the bending region 400 and connected with the ground pins 311 through the flexible circuit board 19. In the bending region 400, traces in respective layers need to be in a same layer, the shielding layer 15 may be connected to the flexible circuit board 19 through leads instead of vias, and connected to the ground pins 311 of the control unit 31, thus making it easier to avoid, the electromagnetic wave signals radiated from the drive arrays 12, from coupling into the transfer traces 16 through the parasitic capacitance between the transfer traces 16 and the cathodes 14. The noise signal strength in the transfer traces 16 and the touch lines 17 may be further effectively reduced, thus further improving the signal-to-noise ratio in the touch lines 17. In turn, the touch performance of the display panel 10 may be further improved, especially the performance of the display panel 10 when the active stylus is used.

In some embodiments, the display panel 10 further includes an encapsulation layer 20. The encapsulation layer 20 is on the side of the cathodes 14 away from the base 11. The shielding layer 15 is between the cathodes 14 and the encapsulation layer 20, which covers the shielding layer 15.

In some embodiments, the display panel 10 further includes anodes 13 and a planarization layer 22. The anode 13 is on a side of the cathodes 14 facing the base 11 and the planarization layer 22 is between the anodes 13 and the base 11. The shielding layer 15 covers edges of the cathodes 14. An orthographic projection of a portion of the shielding layer 15 onto the base 11 is outside the orthographic projections of the cathodes 14 onto the base 11, and the portion of the shielding layer 15 is electrically connected with the drive arrays 12 through vias of the anodes 13 and the planarization layer 22.

Figure 4A:
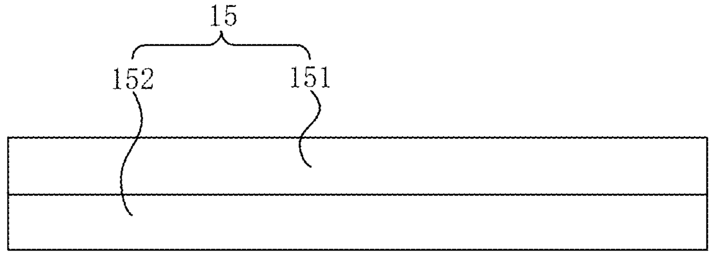
FIG. 4A is a schematic diagram illustrating a structure of a shielding layer in accordance with an embodiment of the present disclosure.
Figure 4B:
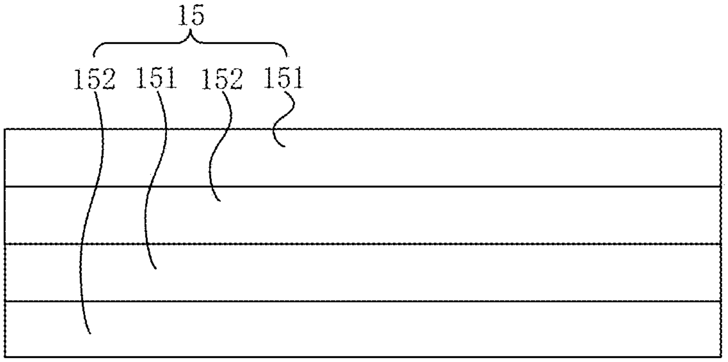
FIG. 4B is a schematic diagram illustrating a structure of another shielding layer in accordance with an embodiment of the present disclosure.

In some embodiments, as shown in FIGS. 4A and 4B, the shielding layer 15 includes at least one metal layer 151 and at least one dielectric layer 152 that are stacked, for example, the shielding layer 15 may include one metal layer 151 and one dielectric layer 152 that are stacked, or the shielding layer 15 may include two metal layers 151 and two dielectric layers 152 that are stacked, or the shielding layer 15 may include three metal layers 151 and three dielectric layers 152 that are stacked, but this is not limited herein. FIG. 4A illustrates a case where the shielding layer includes one metal layer 151 and one dielectric layer 152 that are stacked. FIG. 4B illustrates a case where the shielding layer 15 may include two metal layers 151 and two dielectric layers 152 that are stacked, with the metal layers 151 and the dielectric layers 152 stacked alternatively. The metal layers 151 are connected with each other through vias and the metal layers 151 are connected with the drive arrays 12.

In some embodiments, the dielectric layer includes silicon nitride or silicon oxide, and the metal layer 151 includes at least one of gold, silver, copper, titanium, molybdenum, aluminium, or tungsten.

In some embodiments, the material of the metal layer 151 may be a high-density mesh metal.

In some embodiments, as shown in FIG. 1, the display panel 10 further includes at least two touch portions 300, for example, the display panel 10 may include two touch portions 300, or, the display panel 10 may include three touch portions 300, or, the display panel 10 may include four touch portions 300, or, the display panel 10 may include five touch portions 300, but this is not limited herein. Preferably, the display panel 10 may include four touch portions 300, and the four touch portions 300 are arranged in an array. The touch lines 17 include a plurality of first touch lines 171 and a plurality of second touch lines 172. The plurality of first touch lines 171 extend in a first direction X and the plurality of second touch lines 172 extend in a second direction Y, with the first direction X intersecting the second direction Y in a same plane. Specifically, the first direction X and the second direction Y may be perpendicular to each other. Each touch portion 300 includes a plurality of first touch lines 171 and a plurality of second touch lines 172, and the touch portions 300 are independent of each other.

Figure 5:
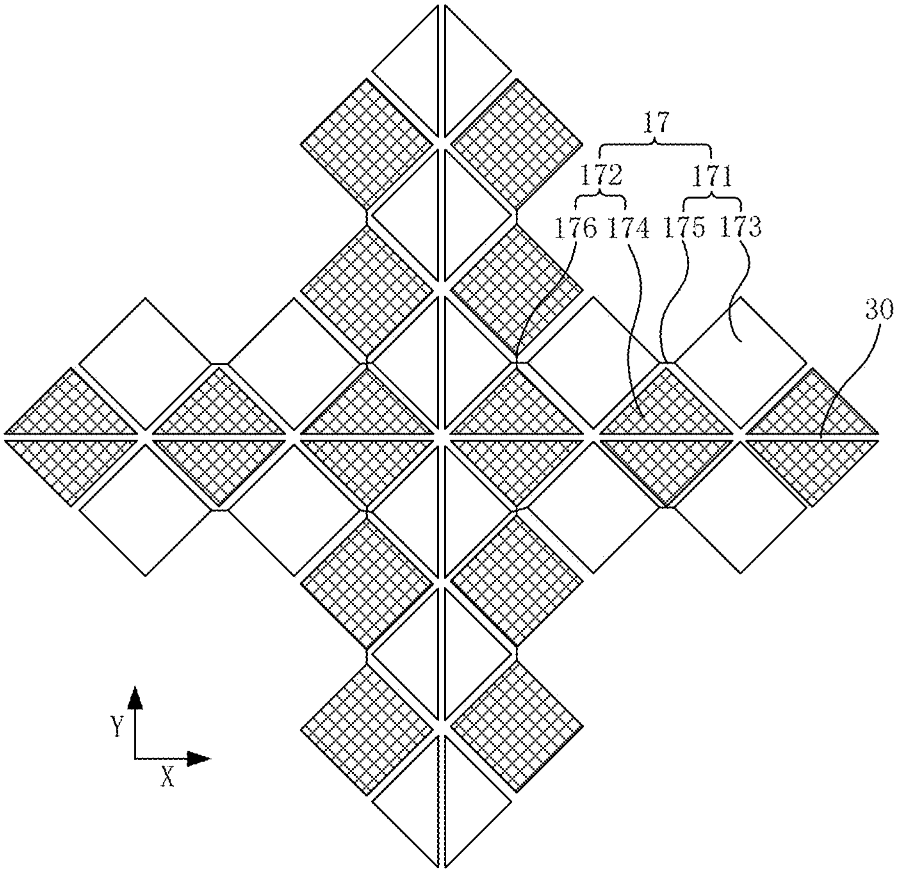
FIG. 5 is a schematic diagram illustrating a structure of a touch portion in accordance with an embodiment of the present disclosure.

FIG. 5 shows an enlarged view of the Q1 region in FIG. 1. As shown in FIG. 5, both the first touch line 171 and the second touch line 172 include touch electrodes. Specifically, the first touch line 171 includes a first touch electrode 173 and a first connector 175, and the first touch electrodes 173 and the first connectors 175 that both are arranged alternately in the first direction X. The second touch line 172 includes a second touch electrode 174 and a second connector 176, and the second touch electrodes 174 and the second connectors 176 that both are arranged alternately in the second direction Y. The first connectors 175 are configured to respectively electrically connect two adjacent first touch electrodes 173 in respective touch portions 300, and the second connectors 176 are configured to respectively electrically connect two adjacent second touch electrodes 174 in respective touch portions 300. There is a gap 30 between two adjacent touch portions 300, and the gap 30 is a boundary between adjacent two touch portions 300. The gap 30 respectively divides the first touch electrodes 173 and the second touch electrodes 174 through which the gap 30 extends into two parts, i.e., the first touch electrodes 173 and the second touch electrodes 174 on an extension path of the gap 30 are respectively divided by the gap 30 into two parts on two sides of the gap 30. It will be noted that the first touch electrode 173 or the second touch electrode 174, which is divided into two parts by the gap 30, is regarded as a first touch electrode 173 or a second touch electrode 174 belonging to the touch portion 300 on two sides of the gap 30, respectively. It will also be noted that although FIG. 5 shows only an enlarged view of the region Q1 in FIG. 1, other parts of the display panel 10 may also refer to the structure illustrated in FIG. 5.

By dividing respective first touch lines 171 and respective second touch lines 172 of the display panel 10 into at least two touch portions 300, it is equivalent to dividing an area of the original touch lines 17 as a whole relative to an area of the cathodes 14 into an area of at least two touch portions 300 relative to the area of the cathodes 14, and since the relative area of respective touch portions 300 to the cathodes 14 is reduced compared to the relative area of the original touch lines 17 as a whole to the cathodes 14, the parasitic capacitance generated between the touch portions 300 and the cathodes 14 is reduced. Since the parasitic capacitance is reduced, the noise signals in the display panel 10 coupled into the touch lines 17 through the parasitic capacitance will also be reduced, thus, it may effectively reduce the noise signal strength in the transfer traces 16 and the touch lines 17, improve the signal-to-noise ratio in the touch lines 17, and in turn, may improve the touch performance of the display panel 10, especially may improve the performance of the display panel 10 when the active stylus is used.

Figure 6:
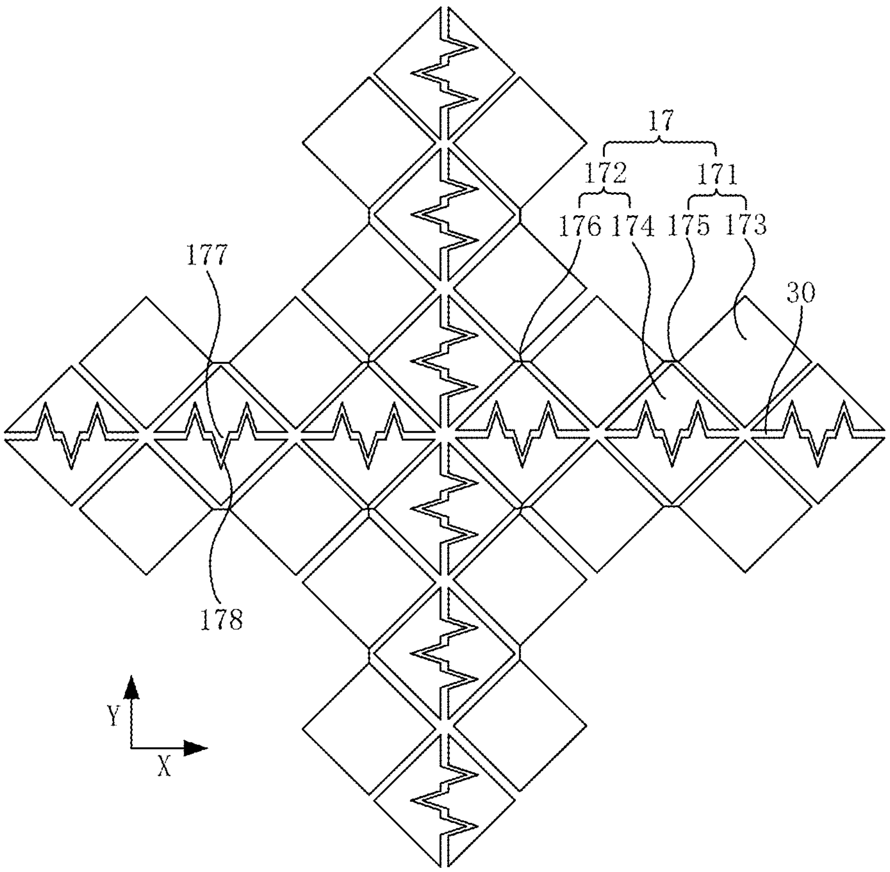
FIG. 6 is a schematic diagram illustrating a structure of another touch portion in accordance with an embodiment of the present disclosure.

In some embodiments, FIG. 6 illustrates another view of an enlarged view of the Q1 region in FIG. 1. As shown in FIG. 6, borders of two adjacent touch portions 300 are interdigitated. When the display panel 10 adopts the structure illustrated in FIG. 5, if the touch points contacting the display panel 10 is at the gap 30, or, if the track formed by the touch points contacting the display panel 10 passes through the gap 30, since the two side of the gap 30 have different touch portions 300, the measurement and calculation of exact coordinates of the touch points may be affected, thus, affecting the degree of accuracy of the touch control. When active stylus control is used for the display panel 10 illustrated in FIG. 5, as the active stylus has a finer tip, it is more likely that the accuracy will be reduced due to the gap 30. And by making the borders of the two adjacent touch portions 300 interdigitated, a distance that the gap 30 extends in a single direction may be reduced, the probability of touch points in the gap 30 may be correspondingly reduced, and in turn, the problem of reduced accuracy of the display panel 10 at the gap 30 may be improved. It will be noted that, while the above design is used, by measuring the signal variation of respective touch portions 300 and combining it with a track algorithm, the control unit 31 may also compensate algorithmically for the track of the touch points at the gap 30.

In some embodiments, as shown in FIG. 6, portions of the first touch lines 171 or portions of the second touch lines 172 on two sides of the gap 30 extend in a direction facing the gap 30 and each form at least one protruding portion 177, and the protruding portion 177 extends into a depression 178 in a corresponding first touch line 171 or a corresponding second touch line 172 on the other side of the gap. Specifically, a portion of a first touch electrode 173 on a side of the gap 30 forms a protruding portion 177, and a first touch electrode 173 on the other side of the gap 30 corresponding to the above first touch electrode 173 is provided with a depression 178. The above protruding portion 177 extends in the direction facing the gap 30 and extends into the depression 178. A protruding portion 177 and a depression 178 of the second touch electrode 174 may be referred to in the previous description of the protruding portion 177 and the depression 178 of the first touch electrode 173. It will be noted that the first touch electrode 173 or the second touch electrode 174, which is divided into two parts by the gap 30, is regarded as a first touch electrode 173 or a second touch electrode 174 belonging to the touch portion 300 on two sides of the gap 30, respectively. In this way, the distance that the gap 30 extends in a single direction may be reduced, thus, the probability of touch points in the gap 30 may be correspondingly reduced, and in turn, the problem of reduced accuracy of the display panel 10 at the gap 30 may be improved.

Figure 7A:
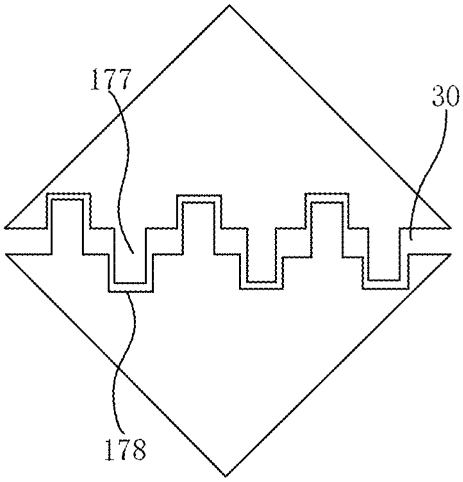
FIG. 7A is a schematic diagram illustrating a shape of a touch electrode in accordance with an embodiment of the present disclosure.
Figure 7B:
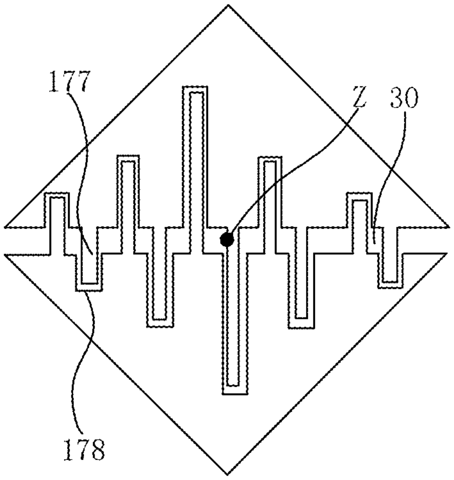
FIG. 7B is a schematic diagram illustrating a shape of another touch electrode in accordance with an embodiment of the present disclosure.

In some embodiments, a shape of an orthographic projection of the protruding portion 177 onto the base is a triangle, a rectangle or a star. For example, the shape of the orthographic projection of the protruding portion 177 onto the base may be a triangle, or the shape of the protruding portion 177 may be a rectangle, or the shape of the protruding portion 177 may be a star, or the shape of the protruding portion 177 may be a part of a triangle or a part of a rectangle, or the shape of the protruding portion 177 may be a part of a triangle or a part of a star, but this is not limited herein. Furthermore, sizes of the protruding portions 177 may be same or, the sizes of the protruding portions 177 may be different from each other. FIGS. 7A and 7B show two specific manners of disposing the protruding portions 177 and the depressions 178. FIG. 7A shows the protruding portions 177 with a same shape and size, FIG. 7B shows the protruding portions 177 with a same shape but different sizes, FIG. 7C shows the protruding portions 177 with a same shape and size evenly distributed, and FIG. 7D shows the protruding portions 177 with a partial star shape.

Figure 7C:
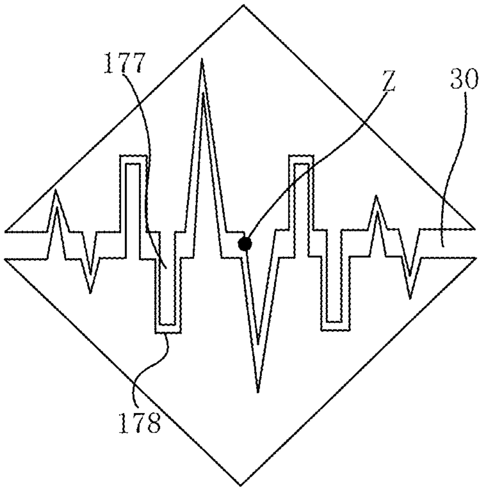
FIG. 7C is a schematic diagram illustrating a shape of another touch electrode in accordance with an embodiment of the present disclosure.
Figure 7D:
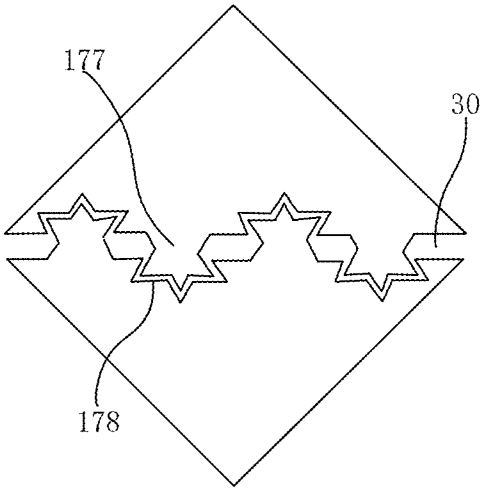
FIG. 7D is a schematic diagram illustrating a shape of another touch electrode in accordance with an embodiment of the present disclosure.

In some embodiments, as shown in FIG. 7B with FIG. 7C, a geometric center of the first touch electrode 173 or the second touch electrode 174 is a center point Z. In a direction away from the central point Z, extending sizes of at least parts of the protruding portions 177 decrease. The sizes of the protruding portions 177 varied with the distance between the edge of the touch electrode away from the gap 30 and the gap 30. In this way, the distance that the gap 30 extends in a single direction may be further reduced, thus, the probability of touch points in the gap 30 may be further correspondingly reduced, and in turn, the problem of reduced accuracy of the display panel 10 at the gap 30 may be further improved.

In some embodiments, as shown in FIG. 1, the display panel 10 further includes at least two control units 31, for example, the display panel 10 may include two control units 31, or, the display panel 10 may include three control units 31, or, the display panel 10 may include four control units 31, but this is not limited herein. Preferably, the display panel 10 may include two control units 31. The transfer traces 16 are on a circumference of the touch portions 300 and the control unit 31 is electrically connected with at least one of the touch portions 300 through the transfer traces 16, and a control unit 31 is electrically connected with a portion of the touch portions 300.

Specifically, the display panel 10 includes an array of four touch portions 300 and two control units 31, and the touch portions 300 include a first touch portion 301, a second touch portion 302, a third touch portion 303 and a fourth touch portion 304. Every two touch portions 300 are electrically connected with a control unit 31 through transfer traces 16, for example, the first touch portion 301 and the second touch portion 302 are electrically connected with a control unit 31 and the third touch portion 303 and the fourth touch portion 304 is electrically connected with another control unit 31, or, the first touch portion 301 and the third touch portion 303 are electrically connected with a control unit 31 and the second touch portion 302 and the fourth touch portion 304 are electrically connected with another control unit 31, or, the first touch portion 301 and the fourth touch portion 304 are electrically connected with a control unit 31 and the second touch portion 302 and the third touch portion 303 are electrically connected with another control unit 31. The control unit 31 is configured to control the first touch line 171 and the second touch line 172 in the touch portion 300 on/electrified or off/unelectrified.

The first transfer traces 161 are configured to electrically connect the first touch lines 171 of the respective touch portions 300 to the control units 31 and the second transfer traces 162 are configured to electrically connect the second touch lines 172 of the respective touch portions 300 to the control units 31. The touch portions 300 being electrically connected with the control units 31 through the transfer trances 16 may be that the touch portions 300 are electrically connected with the flexible circuit board 19 through the transfer traces 16 and the transfer traces 16 are electrically connected with the control units 31 through the flexible circuit board 19. Meanwhile, two control units 31 may be provided with clock signal lines (not shown in the figures), which ensure synchronous operation of the two control units 31 by transmitting clock signals. By providing two control units 31, the two control units 31 are configured to independently drive two different touch portions 300, i.e., the two control units 31 are configured to independently turn the first touch lines 171 and the second touch lines 172 on and off in the two different touch portions 300, and, driving timings of the two control units 31 are synchronised, an envelope curve of sensing signals of the touch points in a same frame may be obtained, thus, complete reporting point coordinates of all positions in the display panel 10 in the same frame signal may be obtained, and in turn, the driving complexity may be reduced.

Figure 8:
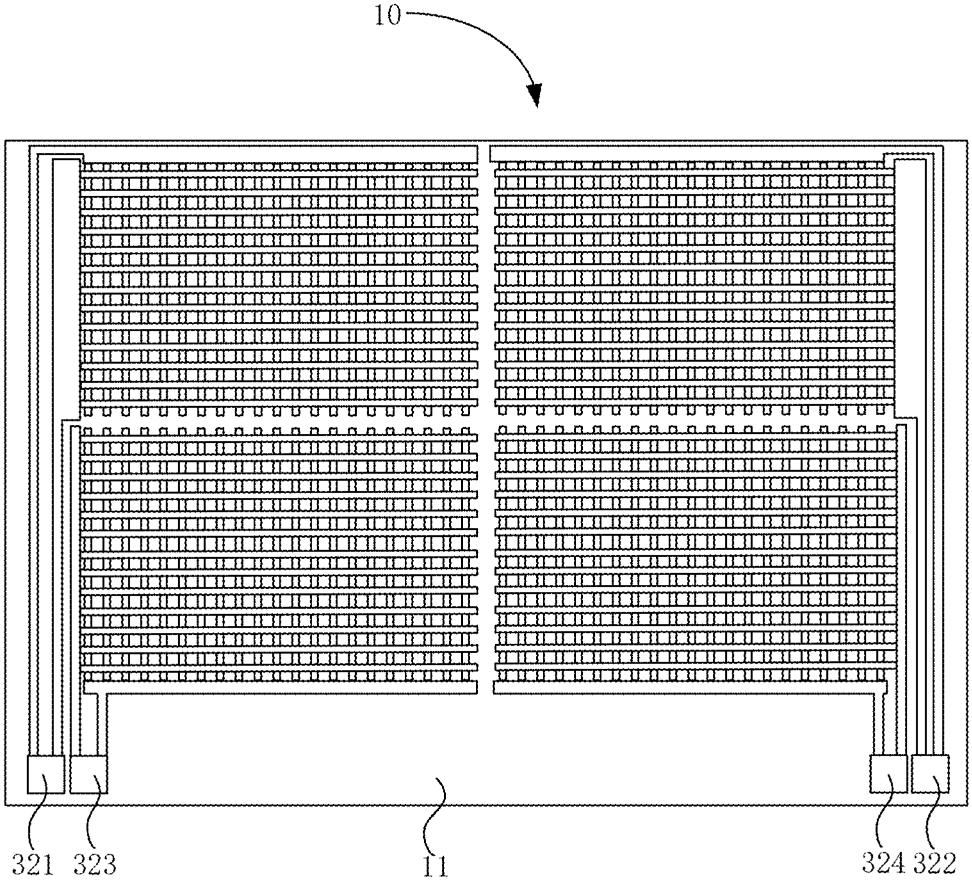
FIG. 8 is a schematic diagram illustrating another display panel in accordance with an embodiment of the present disclosure.
Figure 9:
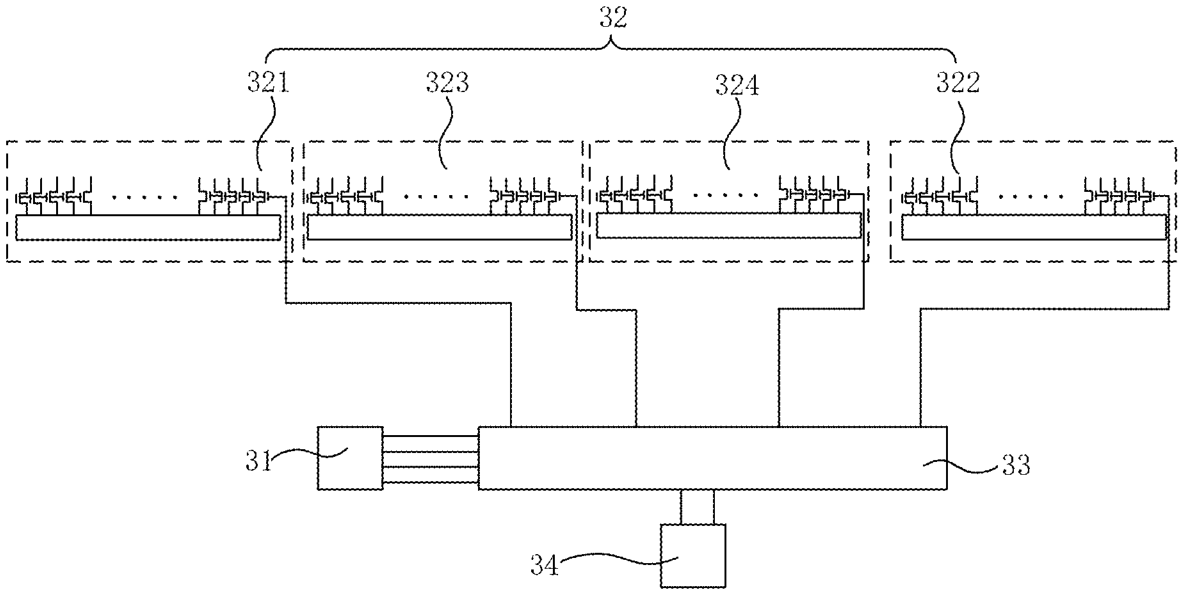
FIG. 9 is a schematic diagram illustrating a manner of connecting a control unit with switch units in accordance with an embodiment of the present disclosure.

In some embodiments, FIGS. 8 and 9 illustrate another embodiment of the display panel 10. As shown in FIGS. 8 and 9, the display panel 10 further includes four touch portions 300 arranged in an array, switch units 32, a level conversion unit 33 and a power management unit 34. Each touch portion 300 is electrically connected with a corresponding switch unit 32 through transfer traces 16. Specifically, a first switch unit 321 may be electrically connected with the first touch portion 301, a second switch unit 322 may be electrically connected with the second touch portion 302, a third switch unit 323 may be electrically connected with the third touch portion 303, and a fourth switch unit 324 may be electrically connected with the fourth touch portion 304. All switch units 32 are electrically connected with the level conversion unit 33 and each switch unit 32 is electrically connected with the control unit 31 through the level conversion unit 33. That is, each touch portion 300 is independently connected with a channel pin of the control unit 31. Therefore, the control unit 31 may control respective switch units 32 to be fully turned off or partially turned off, to independently turn the first touch lines 171 and the second touch lines 172 on and off in each of the touch portions 300. Moreover, the switch units 32 are configured to turn all the first touch lines 171 and second touch lines 172 on and off in a corresponding touch portion 300. Every two touch portions 300 are in a touch group 305. Specifically, four touch portions 300 arranged in an array may be divided into a first touch group 3051 and a second touch group 3052. The control unit 31 is configured to control a touch group 305 at different periods. The power management unit 34 is electrically connected with the level conversion unit 33 and is configured to perform functions of power management.

Figure 10:
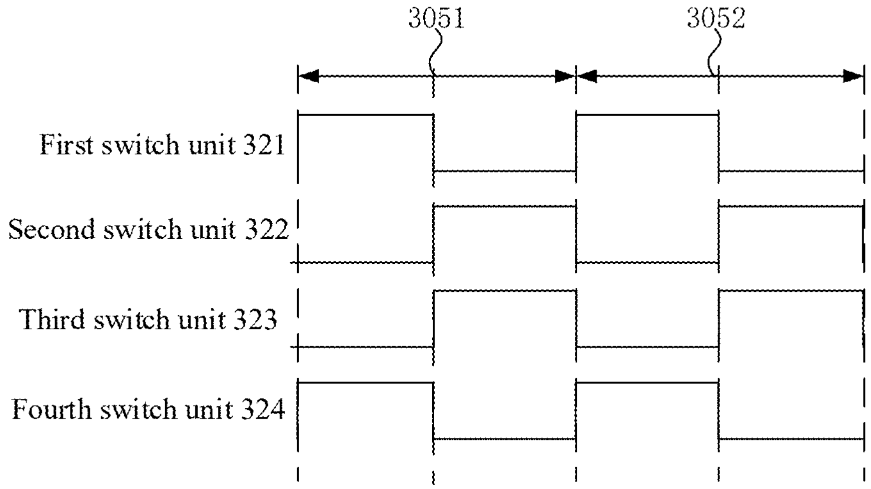
FIG. 10 is a timing diagram of control units controlling switch units in accordance with an embodiment of the present disclosure.

Specifically, FIG. 10 illustrates a timing diagram for the control unit 31 to drive respective switch units 32. As shown in FIG. 10, the control unit 31 may first turn on and drive the first touch group 3051, which includes the first switch unit 321 and the fourth switch unit 324, and then turn on and drive the second touch group 3052, which includes the second switch unit 322 and the third switch unit 323. That is, the control unit 31 drives the first touch portion 301 and the fourth touch portion 304, and then drive the second touch portion 302 and the third touch portion 303, to achieve alternate driving of the touch portions 300 at opposite corners. In this way, during a period of sending control signals by respective switch units 32, the control unit 31 simultaneously drives a portion of the touch portions 300 of the display panel 10 through the switch units 32, so that the relative area of the touch portions 300 driven simultaneously to the cathodes 14 may be further reduced, so that the parasitic capacitance generated between the touch portions 300 and the cathodes 14 is further reduced. Thus, the noise signals in the display panel 10 coupled into the touch lines 17 through the parasitic capacitance may also be reduced, it may effectively reduce the noise signal strength in the transfer traces 16 and the touch lines 17, improve the signal-to-noise ratio in the touch lines 17, and may improve the touch performance of the display panel 10, especially may improve the performance of the display panel 10 when the active stylus is used. Moreover, since a touch group 305 including two touch portions 300 at opposite corners in the four touch portions 300 arranged in an array are alternatively driven, adverse effects of the gap 30 between the touch lines 17 may be reduced.

Figure 11:
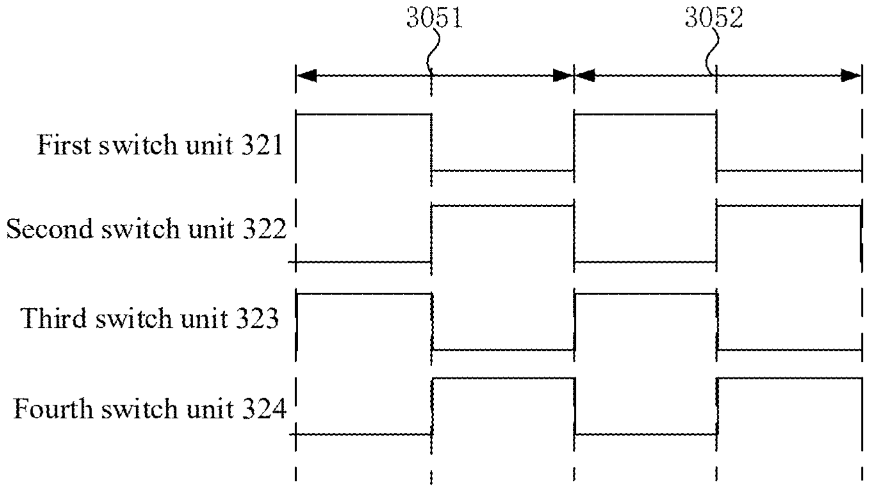
FIG. 11 is a timing diagram of other control units controlling switch units in accordance with an embodiment of the present disclosure.
Figure 12:
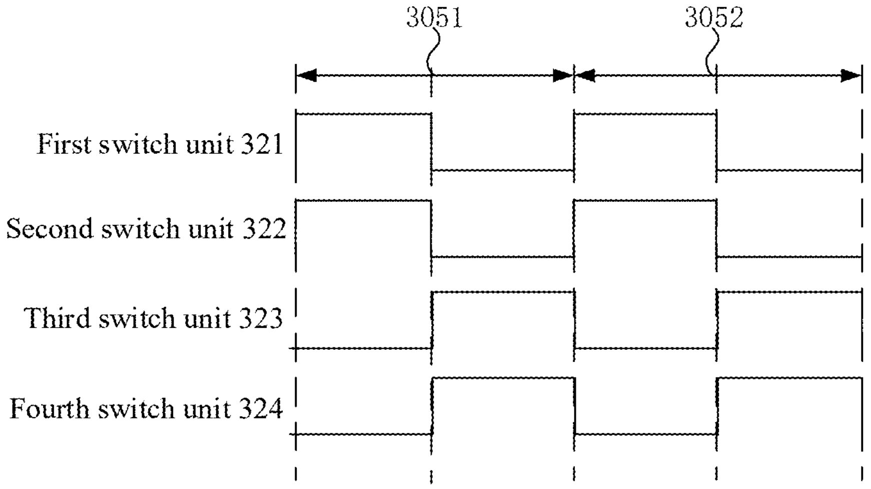
FIG. 12 is a timing diagram of other control units controlling switch units in accordance with an embodiment of the present disclosure.

It will be noted that the control unit 31 is not limited to turning on and driving the first switch unit 321 and the fourth switch unit 324 first, and then turning on and driving the second switch unit 322 and the third switch unit 323, but the control unit 31 may also use other driving sequences. FIG. 11 shows a timing diagram for another control unit to drive the respective switch units. As shown in FIG. 11, the control unit 31 may also first turn on and drive the first touch group 3051, which includes the first switch unit 321 and the third switch unit 323, and then turn on and drive the second touch group 3052, which includes the second switch unit 322 and the fourth switch unit 324, to achieve alternate driving of adjacent two touch portions 300 in the first direction X. Alternatively, FIG. 12 shows a timing diagram for another control unit to drive the respective switch units. As shown in FIG. 12, the control unit 31 may also first turn on and drive the first touch group 3051, which includes the first switch unit 321 and the second switch unit 322, and then turn on and drive the second touch group 3052, which includes the third switch unit 323 and the fourth switch unit 324, to achieve alternate driving of adjacent two touch portions 300 in the second direction Y.

In some embodiments, each switch unit 32 includes at least two thin film transistors connected in parallel. In this way, at least two thin film transistors may be connected in parallel to increase a current of the overall load of the switch units 32, thus, the time delay of the touch signals caused by the switch units 32 may be reduced, and in turn, the effect of the switch units 32 on the touch signals may be reduced.

In some embodiments, an amplitude of an output voltage of the switch unit 32 is not less than 9 volts. In this way, a rising edge time and a falling edge time of the switch signals transmitted from the switch units 32 may be increased, thus, the time delay of the touch electrode signals caused by the switch units 32 may be reduced, and in turn, the effect of the switch units 32 on the touch signals may be reduced.

In some embodiments, the gap 30 between two adjacent touch portions 300 is no greater than 10 microns. Specifically, in the first direction X and the second direction Y, a distance of the gap 30 between two adjacent touch portions 300 may be from 1 micron to 50 micron, for example, in the first direction X and the second direction Y, the distance of the gap 30 between the two adjacent touch portions 300 may be 1 micron, or, in the first direction X and the second direction Y, the distance of the gap 30 between the two adjacent touch portions 300 may be 10 microns, or, in the first direction X and the second direction Y, the distance of the gap 30 between the two adjacent touch portions 300 may be 20 microns, or, in the first direction X and the second direction Y, the distance of the gap 30 between the two adjacent touch portions 300 may be 30 microns, or, in the first direction X and the second direction Y, the distance of the gap 30 between the two adjacent touch portions 300 may be 40 microns, or, in the first direction X and the second direction Y, the distance of the gap 30 between the two adjacent touch portions 300 may be 50 microns, but this is not limited herein.

A display apparatus including any of the above display panels 10 is also provided in the present disclosure. The display apparatus further includes a housing, and the display panel is in the housing.

The display apparatus improves the signal-to-noise ratio of active styluses that support the MPP2.0 protocol, but this is not limited herein. The display apparatus may also be synchronised with all other active stylus protocols, including the USI, HPP, AES and WGP protocols.

In some embodiments, the display apparatus includes a display panel 10 of not less than 10-inch. The problem of noise signals in the display panel 10 is more prominent in display panels 10 of sizes no smaller than 10-inch. Thus, the solution of applying the above display panel 10 in such display apparatuses may better solve the problem of low signal-to-noise ratio due to noisy signals.

The above embodiments of the present disclosure are complementary to each other where no conflict arises.

It is to be noted that in the accompanying drawings, the dimensions of layers and regions may be exaggerated for clarity of illustration. It will be understood that when an element or a layer is referred to as being “above” or “on” another element or layer, it may be directly on the other element, or intervening layers may be present. In addition, it will be understood that when an element or a layer is referred to as being “under” or “below” another element or layer, it may be directly under the other element, or one or more intervening layers or elements may be present. In addition, it will also be understood that when a layer or an element is referred to as being “between” two layers or two elements, it may be the only layer between the two layers or two elements, or one or more intervening layers or elements may be present. Like reference numerals indicate like elements throughout.

The term “a plurality” indicates two or more, unless specifically defined otherwise.

Those skilled in the art will readily conceive other embodiments of the present disclosure upon consideration of the specification and practice of the various embodiments disclosed herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a real scope and spirit of the present disclosure being indicated by the following claims.

It will be understood that the present disclosure is not limited to the precise structure that has been described above and shown in the drawings, and various modifications and changes can be made without departing from its scope. The scope of the present disclosure is limited only by the appended claims.

The invention claimed is:

1. A display panel, wherein the display panel has a display region and a bezel region, and the display region is adjacent to the bezel region;

wherein the display panel comprises:

a base;

drive arrays on the base, configured to drive the display panel to emit light;

cathodes on a side of the drive arrays away from the base;

transfer traces on a side of the cathodes away from the base and located in the bezel region;

touch lines respectively electrically connected with the transfer traces; and a shielding layer between the cathodes and the transfer traces and in the bezel region;

wherein an orthographic projection of the drive arrays in the bezel region onto the base is in an orthographic projection of the shielding layer onto the base;

wherein the shielding layer is configured to shield noise signals;

wherein the shielding layer comprises a metal layer and a dielectric layer that are stacked, the metal layer being connected with the drive arrays.

2. The display panel according to claim 1, further comprising one or more control units, the one or more control units comprising ground pins, the ground pins being configured to be grounded; wherein the shielding layer is connected with the drive arrays and connected with the ground pins through the drive arrays.

3. The display panel according to claim 1, further comprising an encapsulation layer on a side of the cathodes away from the base; wherein the shielding layer is between the cathodes and the encapsulation layer, and the encapsulation layer covers the shielding layer.

4. The display panel according to claim 1, further comprising anodes and a planarization layer; wherein the anodes are on a side of the cathodes facing the base; the planarization layer is between the anodes and the base; the shielding layer covers edges of the cathodes; a projection of a portion of the shielding layer onto the base is outside projections of the cathodes onto the base, and the portion of the shielding layer is electrically connected with the drive arrays through vias penetrating the anodes and the planarization layer.

5. The display panel according to claim 1, wherein the dielectric layer comprises silicon nitride or silicon oxide, and the metal layer comprises gold, silver, copper, titanium, molybdenum, aluminium, tungsten, or any combination thereof.

6. The display panel according to claim 1, further comprising touch portions, the touch portions each comprising a plurality of first touch lines and a plurality of second touch lines; wherein the plurality of first touch lines extend in a first direction and the plurality of second touch lines extend in a second direction, and the first direction and the second direction differ; and the touch portions are independent of each other.

7. The display panel according to claim 6, wherein borders of two adjacent touch portions among the touch portions are interdigitated.

8. The display panel according to claim 7, wherein a gap is provided between the two adjacent touch portions, and the gap is defined by borders of the two adjacent touch portions; portions of the first touch lines or portions of the second touch lines on two sides of the gap extend in a direction towards the gap and each forms at least one protruding portion that extends into a depression in a corresponding first touch line among the first touch lines or a corresponding second touch line among the second touch lines on other side of the gap opposite the at least one protruding portion.

9. The display panel according to claim 8, wherein a shape of the protruding portion is a triangle, a rectangle or a star.

10. The display panel according to claim 8, wherein the first touch lines each comprise first touch electrodes and first connectors that both are arranged alternately in the first direction, and the second touch lines each comprise second touch electrodes and second connectors that both are arranged alternately in the second direction; the gap divides the first touch electrodes or the second touch electrodes through which the gap extends into two parts respectively;

portions of the first touch electrodes or portions of the second touch electrodes on the two sides of the gap extend in a direction towards the gap and each form the at least one protruding portion that respectively extends into a depression in a corresponding first touch electrode among the first touch electrodes or a corresponding second touch electrode among the second touch electrodes on the other side of the gap;

in directions away from geometric centers of the first touch electrodes or the second touch electrodes, an extending size of the at least one protruding portion gradually decreases.

11. The display panel according to claim 6, comprising at least two control units; wherein the transfer traces are on a circumference of the touch portions and the control units are electrically connected with at least one of the touch portions through the transfer traces, and each of the control units is electrically connected with a portion of the touch portions and is configured to electrify the plurality of first touch lines and the plurality of second touch lines in the portion of the touch portions.

12. The display panel according to claim 11, wherein the touch portions comprise four touch portions arranged in an array; wherein every two of the four touch portions are electrically connected with a control unit among the control units through the transfer traces respectively; the control unit is configured to independently drive corresponding two touch portions among the touch portions.

13. The display panel according to claim 6, wherein the touch portions comprise four touch portions arranged in an array, switch units, one or more control units and a level conversion unit; wherein the four touch portions each are electrically connected with a corresponding switch unit among the switch units through the transfer traces; all of the switch units are electrically connected with the level conversion unit and the switch units each are electrically connected with the one or more control units through the level conversion unit;

every two of the four touch portions form a touch group; the one or more control units are configured to drive the first touch lines and the second touch lines in the touch group at different periods.

14. The display panel according to claim 13, wherein every two of the four touch portions arranged in an array which are adjacent to each other in the first direction, form a touch group respectively among touch groups;

the one or more control units are configured to drive the first touch lines and the second touch lines in one touch group among the touch groups for a first period and drive the first touch lines and the second touch lines in other touch group among the touch groups for a second period.

15. The display panel according to claim 13, wherein every two of the four touch portions arranged in an array and adjacent to each other in the second direction, form a touch group respectively among touch groups;

the one or more control units are configured to drive the first touch lines and the second touch lines in one touch group among the touch groups for a first period and drive the first touch lines and the second touch lines in other touch group among the touch groups for a second period.

16. The display panel according to claim 13, wherein every two of the four touch portions arranged in an array, which are at opposite corners of the array, form a touch group respectively among touch groups;

the one or more control units are configured to drive the first touch lines and the second touch lines in one touch group among the touch groups for a first period and drive the first touch lines and the second touch lines in other touch group among the touch groups for a second period.

17. The display panel according to claim 13, wherein the switch units each comprise at least two thin film transistors connected in parallel.

18. A display apparatus comprising the display panel of claim 1; and a housing, wherein the display panel is in the housing.

19. A display panel, wherein the display panel has a display region and a bezel region, and the display region is adjacent to the bezel region;

wherein the display panel comprises:

a base;

drive arrays on the base, configured to drive the display panel to emit light;

cathodes on a side of the drive arrays away from the base;

transfer traces on a side of the cathodes away from the base and located in the bezel region;

touch lines respectively electrically connected with the transfer traces; and a shielding layer between the cathodes and the transfer traces and in the bezel region;

wherein an orthographic projection of the drive arrays in the bezel region onto the base is in an orthographic projection of the shielding layer onto the base;

wherein the shielding layer is configured to shield noise signals, wherein the display panel further comprises one or more control units, the one or more control units comprises shield pins, wherein the shield pins are configured to transmit shield signals, and the shield signals are in an opposite direction to signals transmitted in the transfer traces;

wherein the shielding layer is connected with the drive arrays and connected with the shield pins through the drive arrays.

20. A display panel, wherein the display panel has a display region and a bezel region, and the display region is adjacent to the bezel region;

the display panel comprises:

a base;

drive arrays on the base, configured to drive the display panel to emit light;

cathodes on a side of the drive arrays away from the base;

transfer traces on a side of the cathodes away from the base and located in the bezel region;

touch lines respectively electrically connected with the transfer traces; and a shielding layer between the cathodes and the transfer traces and in the bezel region; an orthographic projection of the drive arrays in the bezel region onto the base, being in an orthographic projection of the shielding layer onto the base; the shielding layer being configured to shield noise signals, wherein the display panel further has a bending region adjacent to the bezel region and on a side of the bezel region away from the display region; a portion of the display panel in the bending region is configured to be bent to a side of the base away from the cathode; the display panel further comprises a flexible circuit board on a side of the bending region away from the bezel region;

wherein the display panel further comprises one or more control units comprising ground pins, and the ground pins are configured to be grounded; in the bending region, the shielding layer is connected with the flexible circuit board through leads and connected with the ground pins through the flexible circuit board.

* * * * *